(12) United States Patent
Shingleton et al.

(10) Patent No.: US 6,559,371 B2
(45) Date of Patent: May 6, 2003

(54) HIGH-CONCENTRATION PHOTOVOLTAIC ASSEMBLY FOR A UTILITY-SCALE POWER GENERATION SYSTEM

(75) Inventors: Jefferson G. Shingleton, Auburn, NY (US); Herbert T. Hayden, Tempe, AZ (US)

(73) Assignee: Pinnacle West Capital Corp., Phoenix, AZ (US)

( * ) Notice: Subject to any disclaimer, the term of this patent is extended or adjusted under 35 U.S.C. 154(b) by 0 days.

(21) Appl. No.: 09/894,245

(22) Filed: Jun. 27, 2001

(65) Prior Publication Data

US 2003/0000564 A1 Jan. 2, 2003

(51) Int. Cl.[7] .................................... H01L 31/052
(52) U.S. Cl. .................................. 136/246; 136/251
(58) Field of Search ........................ 136/244, 246, 136/251, 259; 52/173.3; 126/600–608, 573–582, 700, 704; 248/542, 688, 127, 371, 158, 176.1

(56) References Cited

U.S. PATENT DOCUMENTS

| | | | |
|---|---|---|---|
| 4,422,443 A | * 12/1983 | Arendt .................... | 126/570 |
| 4,966,631 A | 10/1990 | Matlin et al. ............. | 136/244 |
| 5,125,608 A | 6/1992 | McMaster et al. ........ | 248/163 |
| 5,125,983 A | 6/1992 | Cummings ............... | 136/246 |
| 5,374,317 A | 12/1994 | Lamb et al. .............. | 136/246 |
| 5,408,990 A | * 4/1995 | Edling et al. ............. | 126/683 |
| 5,677,833 A | 10/1997 | Bingley ................... | 363/71 |
| 5,896,281 A | 4/1999 | Bingley ................... | 363/71 |
| 6,058,930 A | 5/2000 | Shingleton ............... | 126/600 |
| 6,169,678 B1 | 1/2001 | Kondo et al. ............. | 363/71 |

* cited by examiner

Primary Examiner—Nam Nguyen
Assistant Examiner—Brian L Mutschler
(74) Attorney, Agent, or Firm—Lowell W. Gresham; Jordan M. Meschkow; Charlene R. Jacobsen

(57) ABSTRACT

A high-concentration photovoltaic assembly (24) for use in a utility-scale solar power generation system (20) is configured to couple to a supporting tracking structure (22) of the system (20). The assembly (24) incorporates a frame (38) substantially centered in a plane (44), a plurality of substantially parallel longitudinal members (80) substantially centered in the plane (44) and coupled to the frame (38), two substantially parallel transverse members (82) substantially centered in the plane (44) and coupled to the longitudinal members (80) substantially at ends thereof, a plurality of bulkheads (90) coupled between adjacent ones of the longitudinal members (80) and configured to divide the assembly (24) into a plurality of chambers (94), a plurality of photovoltaic modules coupled to the chambers (94) upon a first side (48) of the plane (44), and a plurality of lenses (98) coupled to the chambers (94) upon a second side (46) of the plane (44).

30 Claims, 7 Drawing Sheets

HIGH-CONCENTRATION PHOTOVOLTAIC ASSEMBLY FOR A UTILITY-SCALE POWER GENERATION SYSTEM

TECHNICAL FIELD OF THE INVENTION

The present invention relates to the field of photovoltaic power generation. More specifically, the present invention relates to the field of utility-scale high-concentration photovoltaic power generation.

BACKGROUND OF THE INVENTION

Silicon photovoltaic (PV) cells directly convert light into electricity. This provides a non-polluting renewable source of electrical energy. An electrical generating system utilizing PV cells is a PV system.

PV systems are generally made up of arrays of PV cells (PV arrays). PV arrays may be fixed, or may have one-axis or two-axis tracking. Fixed arrays are substantially immovable. At any given instant, maximum power output is obtained when the angle of solar incidence is perpendicular to the effective aperture (i.e., receptive surface area of the array). That is, a line between the sun and the array is perpendicular to the plane of the aperture. The average annual output of a fixed PV array is maximized when the array is aimed approximately at mean true solar noon. That is, the array would ideally be positioned so the plane of the aperture is substantially perpendicular to a line extending to the mean true solar noon position of the sun.

A PV array using one-axis tracking pivots around a single axis to better track the sun across the sky. Ideally, one-axis tracking causes the angle of solar incidence to be coincident with a plane perpendicular to both the plane of the aperture and the plane of rotation of the array. The average annual output would be maximized when the array is angled to track approximately through the mean true solar noon position of the sun.

A PV array using two-axis tracking pivots around two axes to best track the sun across the sky. Because two axes are used, the sun may be accurately tracked to provide a substantially perpendicular angle of solar incidence at all times from dawn to dusk every day of the year.

PV arrays may be non-concentrating or concentrating. In a non-concentrating array, sunlight falls directly upon the PV cells making up the array. The aperture is therefore the collective area of the PV cells.

Non-concentrating PV arrays produce power from sunlight with any reasonable positive angle of incidence. Non-concentrating arrays therefore lend themselves to fixed and one-axis tracking arrays, where the angle of solar incidence is not normally perpendicular to the plane of the aperture. This, of course, does not exclude a non-concentrating array from having two-axis tracking.

In a concentrating photovoltaic array, sunlight falling upon lenses or mirrors is focussed onto the PV cells making up the array. That is, the aperture is substantially equal to the area of the lenses or mirrors, and the sunlight is focussed onto the substantially smaller area of the PV cells.

Concentrating PV arrays require that the sunlight be focussed upon the PV cells. To do this, each PV cell is located substantially at the primary focal point of the associated lens or mirror. This means that the angle of solar incidence must be such that the sunlight is directed to the appropriate focal points. The effective plane of the aperture is therefore perpendicular to the solar incidence. A typical concentrating PV array uses two-axis tracking to maintain perpendicularity.

The higher the concentration of an array, the smaller the amount of PV cell area required for a given aperture. The maximum concentration is partly limited by the ability of the individual PV cells to handle and dispose of heat. High-concentrating photovoltaic (HCPV) arrays having concentrations between 200 and 300 are fully realizable.

A problem arises with HCPV arrays in that the high concentration necessitates a high tracking accuracy. This results in more precise (and more expensive) two-axis tracking mechanisms than are required for lower-concentration arrays.

Typical PV systems may be instrument-scale, small-scale, or utility-scale. An instrument-scale PV system typically uses a single non-concentrating fixed array to power an individual device. Typically, the PV array is proportionate to the device to be powered. That is, an array may contain one to dozens of PV cells and have a power output from a few milliwatts to several watts.

A small-scale PV system typically uses non-concentrating fixed or one-axis tracking arrays to fully or partially power a residence, commercial establishment, or an industrial or agricultural device (e.g., a remotely located pump). A small-scale PV system may be formed of one or more arrays, may contain from several hundreds to several thousands of PV cells, and have a power output in the range of one to twenty-five kilowatts.

A utility-scale PV system is a solar power-generation station, and serves essentially the same functions as fossil fuel or nuclear power-generation stations. Solar power generation has an advantage in that solar energy is a fully renewable, non-polluting resource. The sunlight is present each day weather permits.

The electricity produced by solar power-generation stations, however, currently has a considerably greater cost per megawatt than that produced by fossil fuel and nuclear power-generation stations. There exists a long-felt need for reductions in the per-megawatt cost of solar power generation to make utility-scale PV systems more feasible.

A utility-scale PV system may be used by a utility to produce power for the public power grid. The power thus produced may be used to augment the power already available on the public grid during the times of sunlight, thereby providing supplemental power when it is most needed. A utility-scale PV system may also be used to provide power where the public power grid is not available, e.g., a remote village.

A utility-scale PV system may be formed of large arrays or array clusters containing from thousands to millions of PV cells. Each large array or array cluster typically has a power output in excess of twenty kilowatts, with the system having a total power output of tens or hundreds of megawatts.

The arrays or array clusters of a utility-scale PV system may be independently coupled to the power grid. Therefore, while a PV system may have a number of substantially identical arrays, this is not a requirement. A given PV system may be a power-generation complex having a mixture of non-concentrating and/or concentrating fixed, one-axis tracking, and/or two-axis tracking arrays.

Utility-scale PV systems may have power outputs of tens or hundreds of megawatts. The per-unit-area fabrication costs of a PV array decrease as the array is increased in size. Also, the cost of PV cells (the silicon cost) is a significant factor in large arrays. The greater the ratio of aperture area to PV cell area, the lower the silicon cost of a given array. Concentrating arrays have fewer PV cells per unit area of aperture than non-concentrating arrays. At some point in the transition between small-scale and utility-scale systems, it becomes preferable to utilize large HCPV arrays over non-concentrating arrays. The use of HCPV arrays, however, requires more expensive two-axis tracking.

The arrays of a utility-scale PV system may be quite large. Such arrays are often too large to be transported by conventional means (e.g., by rail and/or truck). Such large arrays must be either fully or partially assembled in the field. This results in a significant increase in labor costs and in the time it takes to bring the array on line. When the arrays are HCPV arrays, the required tracking accuracy requires an increase in field alignment time. With conventional field assembly and alignment techniques, the result may be an untenable overall PV system cost.

Desirably, HCPV arrays are rigid. That is, an HCPV array desirably has all PV cells therein properly aligned at all times and in all attitudes. If an HCPV array has insufficient rigidity, then that array is subject to deflection. Deflection is the optical misalignment of one or more PV cells in an array due to bending of the array. A deflected PV cell has a different optical alignment than a non-deflected PV cell. An array may suffer deflection due to gravity (i.e., dead-load deflection) and wind (i.e., wind-load deflection). For arrays using lenses, the amount of dead-load deflection varies with the attitude of the array. That is, the dead-load deflection is most pronounced when the array is horizontal and substantially zero when the plane of the aperture is vertical.

Large HCPV arrays must be rigid enough to support their own weight while maintaining proper optical alignment of all PV cells therein. This typically results in arrays that have elaborate, cumbersome, and/or massive supporting structures. These complex supporting structures are themselves typically assembled on site, and therefore add to the cost increases.

SUMMARY OF THE INVENTION

Accordingly, it is an advantage of the present invention that an assembly of high-concentration photovoltaic modules is provided for use in a utility-scale power generation system.

It is another advantage of the present invention that the assembly may be fabricated and aligned in a factory.

It is another advantage of the present invention that the assembly may be readily transportable by truck from the factory to the PV system site.

It is another advantage of the present invention that the assembly is sufficiently rigid to support its own weight and maintain alignment during use.

It is another advantage of the present invention that the assembly contains a frame configured to support the assembly and couple the assembly to a supporting tracking structure of the PV system.

It is another advantage of the present invention that the assembly is one of a plurality of substantially identical assemblies configured to mount to one supporting tracking structure of a PV system.

The above and other advantages of the present invention are carried out in one form by a high-concentration photovoltaic assembly configured for use in a utility-scale power generation system. The assembly has a plurality of substantially parallel framing members substantially centered in a plane and configured to couple to a supporting tracking structure of the system. The assembly also has a plurality of substantially parallel longitudinal members substantially centered in the plane and coupled to the framing members proximate ends thereof. The assembly also has a plurality of photovoltaic modules coupled to adjacent ones of the longitudinal members upon a first side of the plane. The assembly also has a plurality of lenses coupled to adjacent ones of the longitudinal members upon a second side of the plane.

The above and other advantages of the present invention are carried out in one form by a high-concentration photovoltaic assembly configured for use in a utility-scale power generation system. The assembly has a frame substantially centered in a plane and configured to couple to a supporting tracking structure of the system. The assembly also has a plurality of substantially parallel longitudinal members coupled to the frame. The assembly also has two substantially parallel transverse members coupled to the longitudinal members substantially at ends thereof. The assembly also has a plurality of photovoltaic modules coupled to adjacent ones of the longitudinal members upon a first side of the plane. The assembly also has a plurality of lenses coupled to adjacent ones of the longitudinal members upon a second side of the plane.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF THE PREFERRED EMBODIMENTS

Figure 1:
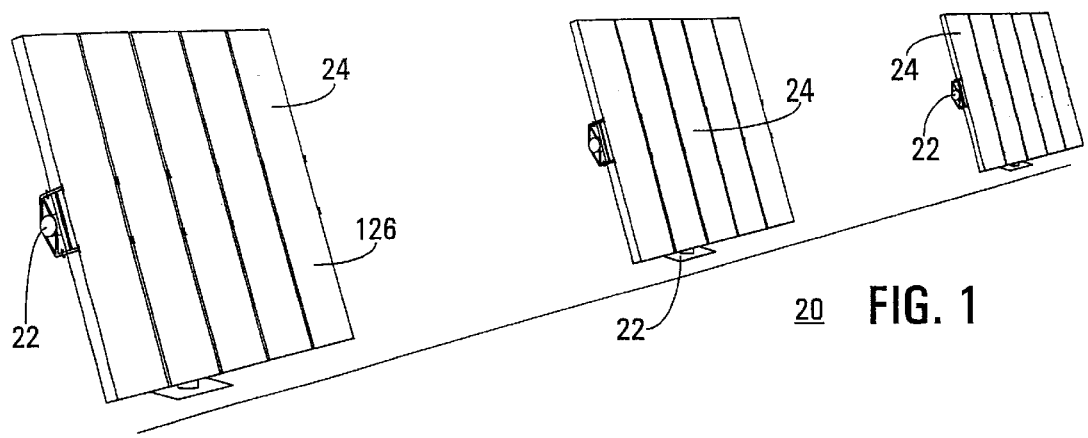
FIG. 1 shows a perspective front view of a portion of a utility-scale generating system having a plurality of supports with pluralities of high-concentration photovoltaic assemblies coupled thereto in accordance with a preferred embodiment of the present invention.
Figure 2:
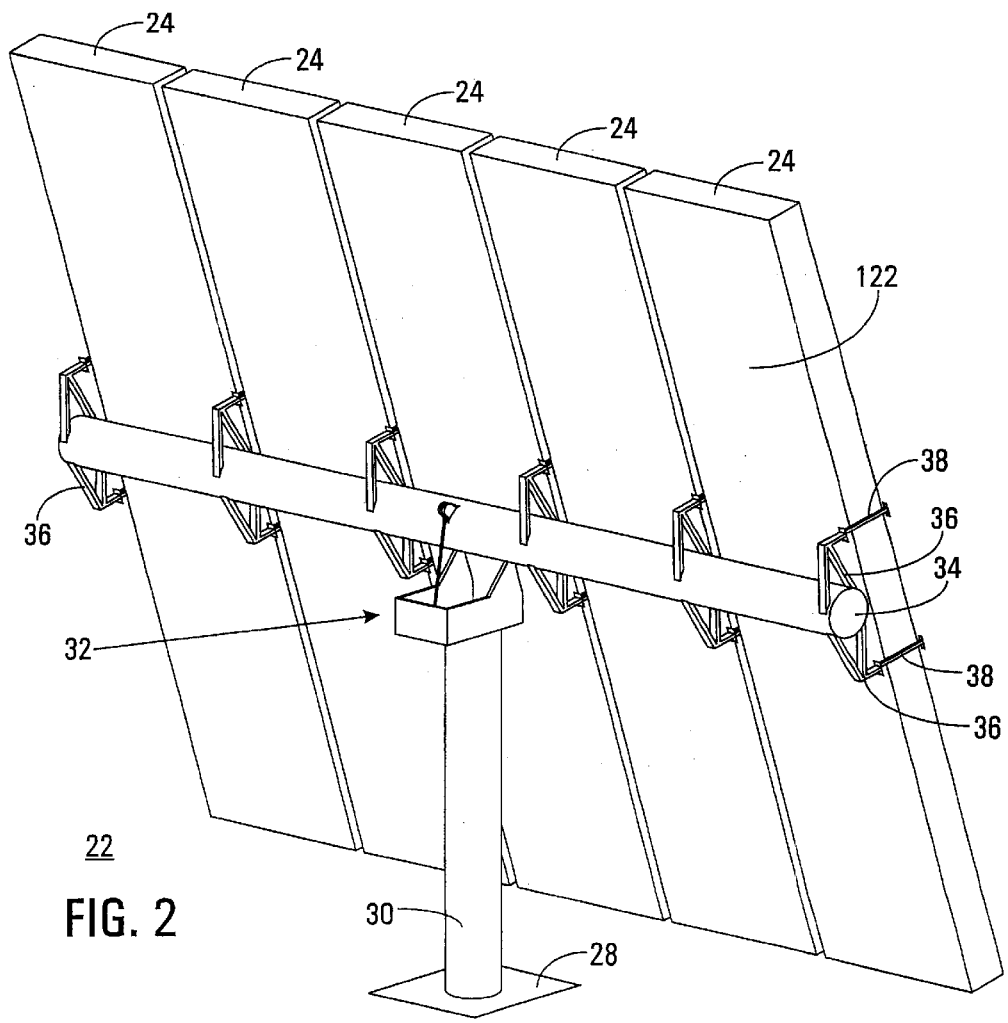
FIG. 2 shows an oblique back view of a support with a plurality of high-concentration photovoltaic assemblies coupled thereto in accordance with a preferred embodiment of the present invention.
Figure 3:
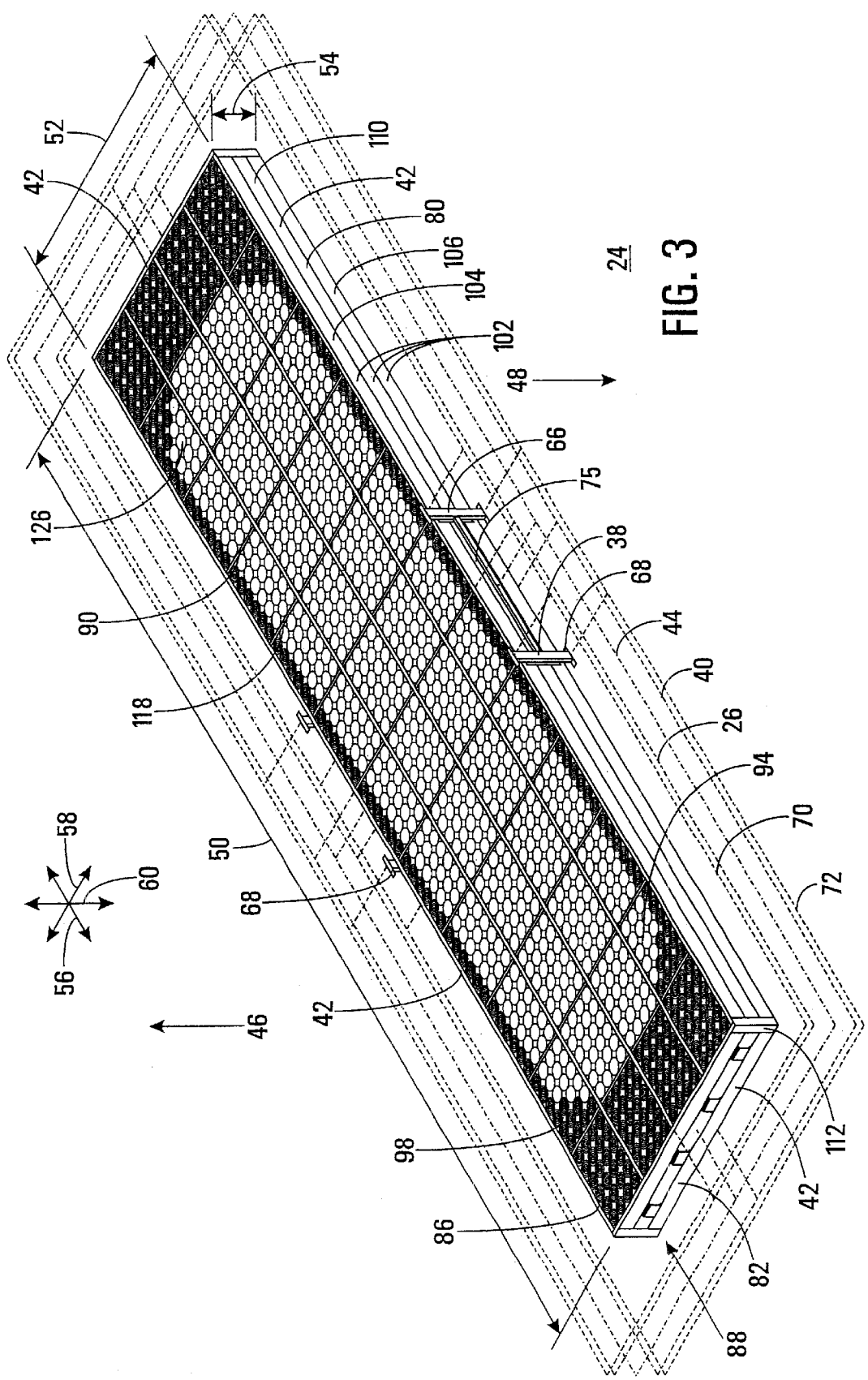
FIG. 3 shows an oblique front view of a high-concentration photovoltaic assembly in accordance with a preferred embodiment of the present invention.

FIG. 1 shows a perspective front view of a portion of a utility-scale generating system 20 having a plurality of supports 22, FIG. 2 shows an oblique back view of a single support 22 with a plurality of high-concentration photovoltaic assemblies 24 coupled thereto, and FIG. 3 shows an oblique front view of a single such assembly 24 in accordance with a preferred embodiment of the present invention. The following discussion refers to FIGS. 1 through 3.

FIG. 1 depicts a portion of a utility-scale high-concentration photovoltaic (HCPV) generating system 20. For purposes of the present discussion, a photovoltaic system 20 is a system configured to convert light, i.e., electromagnetic radiation formed primarily of photons having greater energy than radio (i.e., microwave or millimeter-wave) radiation, into electrical energy (power).

A utility scale HCPV system 20 must be capable of generating a sufficient quantity of power to be practical for utility company use. For purposes of the present discussion, this is assumed to be at least 20 kW$_p$ (peak kilowatts). In the preferred embodiment depicted, system 20 contains a plurality of supports (supporting tracking structures) 22, with each support 22 supporting a plurality of HCPV assemblies 24.

HCPV assemblies 24 are sized and configured to be factory assembled, then transported to the desired site and mounted to supports 22. This effects a significant reduction in assembly costs over on-site assembly. Additional cost reductions may be realized by configuring components of supports 22 to also be factory assembled.

In the preferred embodiment (discussed in more detail hereinafter), each HCPV assembly generates approximately 4.8 kW$_p$. Each support 22 supports five HCPV assemblies 24, thereby producing 24 kW$_p$ per support 22 for system 20. The depiction of five assemblies 24 per support 22 is arbitrary. Those skilled in the art will appreciate that supports 22 may be constructed that will support more than five assemblies 24.

Assemblies 24 are high-concentration photovoltaic assemblies 24. System 20 is therefore an HCPV system. Each support 22 incorporates high-accuracy two-axis tracking to maintain an aperture plane 26 (FIG. 3) of each assembly 24 substantially perpendicular to the angle of solar incidence (not shown) in order for assemblies 24 to function efficiently.

The design and implementation of supports 22 is beyond the scope of the present invention. Any design and/or implementation well known to those skilled in the art may be used. In the preferred embodiment of FIGS. 1 and 2, each support 22 is formed of a foundation 28, a support pedestal 30 anchored to foundation 28, a two-axis tracking mechanism 32 coupled to support pedestal 30, a torsion tube 34 coupled to tracking mechanism 32, and a plurality of mounts 36 affixed to torsion tube 34 and configured to couple to a frame 38 of each HCPV assembly 24.

Economics and available space are limiting factors in the number of supports 22 feasible in system 20. For example, 400 such supports 22, each having five assemblies 24 producing 4.8 kW$_p$ each, would produce 9.6 MW$_p$ (peak megawatts).

Figure 4:
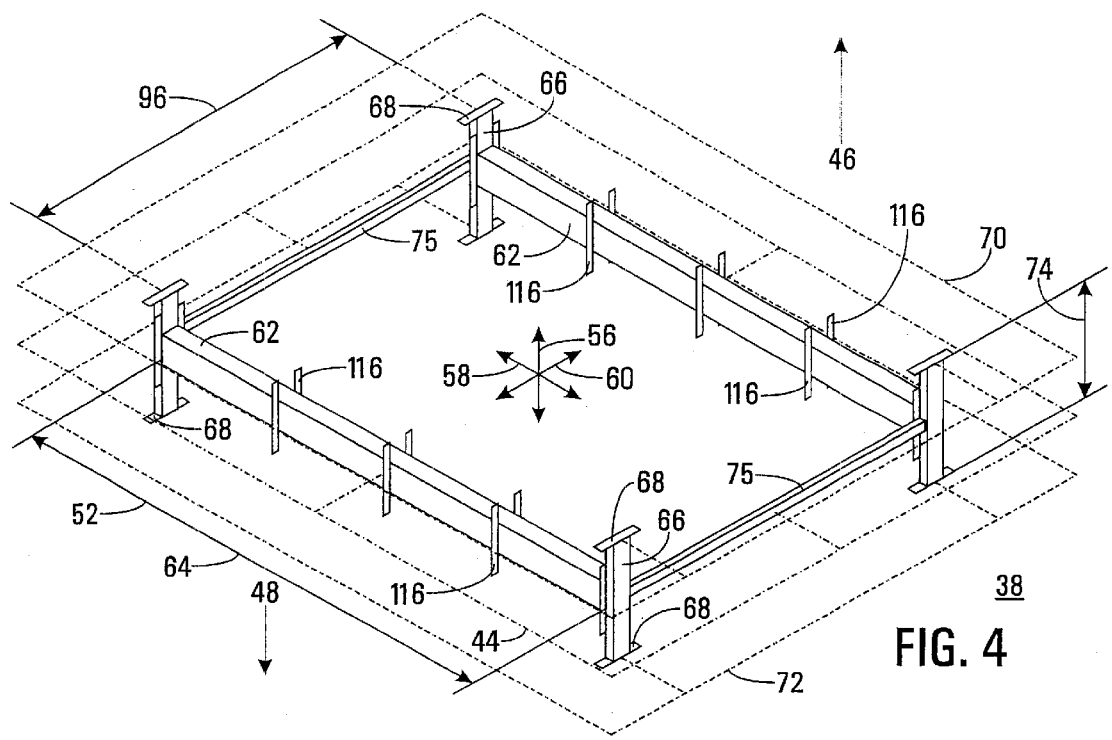
FIG. 4 shows an oblique front view of a frame for a high-concentration photovoltaic assembly in accordance with a preferred embodiment of the present invention.

FIG. 4 shows an oblique front view of frame 38 for HCPV assembly 24 in the same orientation as FIG. 3 and in accordance with a preferred embodiment of the present invention. The following discussion refers to FIGS. 2, 3, and 4.

Each HCPV assembly 24 includes frame 38. Frame 38 serves to provide structural support and rigidity to assembly 24, to couple assembly 24 to support 22, and to facilitate transport of assembly 24.

Aperture plane 26 is a front plane 26 of HCPV assembly 24. HCPV assembly 24 also has a back plane 40. Front and back planes 26 and 40 are substantially parallel planes defining the front and back of perimeter members 42 of assembly 24. A central reference plane 44 is located substantially midway between and substantially parallel to front and back planes 26 and 40. Front plane 26 is located on a front side 46 of reference plane 44. Likewise, back plane 40 is located on a back side 48 of reference plane 44.

Perimeter members 42, discussed in more detail hereinafter, form a substantially right parallelepipedic structure that defines the basic shape of HCPV assembly 24, less frame 38. This structure has a longitudinal dimension (length) 50, a transverse dimension (breadth) 52, and a perpendicular dimension (depth) 54 relative to reference plane 44. Length 50 is measured in a longitudinal direction 56, i.e., a direction substantially parallel to reference plane 44 along an axis substantially parallel to the longest dimension of the right parallelepipedic structure. Breadth 52 is measured in a transverse direction 58, i.e., a direction substantially parallel to reference plane 44 and substantially perpendicular to longitudinal direction 56. Depth 54 is measured in a perpendicular direction 60, i.e., a direction substantially perpendicular to reference plane 44.

In the preferred embodiment, frame 38 is made up of two substantially parallel framing members 62. Reference plane 44 passes through the centers of framing members 62, i.e., framing members 62 are centered within HCPV assembly 24. Framing members 62 intersect HCPV assembly 24 transversely, i.e., across breadth 52 through perimeter members 42 of assembly 24 substantially parallel to aperture plane 26. The length 64 of each framing member is substantially equal to or greater than breadth 52.

Framing members 62 are the primary load-bearing members of assembly 24. The entire weight of assembly 24 rests upon framing members 62. Framing members 62 are therefore made of rigid metallic tubing. In the preferred embodiment, framing members 62 are a conventional steel tubing having have a round-cornered rectangular cross section of approximately 12.7×17.8 cm (5×7 inches) and a wall thickness of approximately 0.64 cm (0.25 inch).

A leg 66 is affixed to each end of framing members 62 in a direction substantially perpendicular to reference plane 44. Since framing members 62 have lengths 64 substantially equal to or greater than breadth 52, legs 66 are external to perimeter members 42.

A foot 68 is affixed to each end of each leg 66 of frame 38. Legs 66 are dimensioned so that the four feet 68 on front side 46 of reference plane 44 lie in a front foot plane 70 substantially parallel to reference plane 44. Similarly, the four feet 68 on back side 46 of reference plane 44 lie in a back foot plane 72 substantially parallel to reference plane 44. Front and back foot planes 70 and 72 are farther from reference plane than front and back planes 26 and 44 (FIG.

3), respectively. That is, legs 66 have a length 74 that is greater than depth 54 of perimeter members 42. The "thickest" parts of HCPV assembly 24 are at feet 68 on the ends of frame legs 66.

In the preferred embodiment, legs 66 are coupled by crossbars 75, giving frame 38 a substantially rectangular shape. It will be understood that crossbars 75 are an artifact of the assembly techniques and not a requirement of the present invention.

Figure 5:
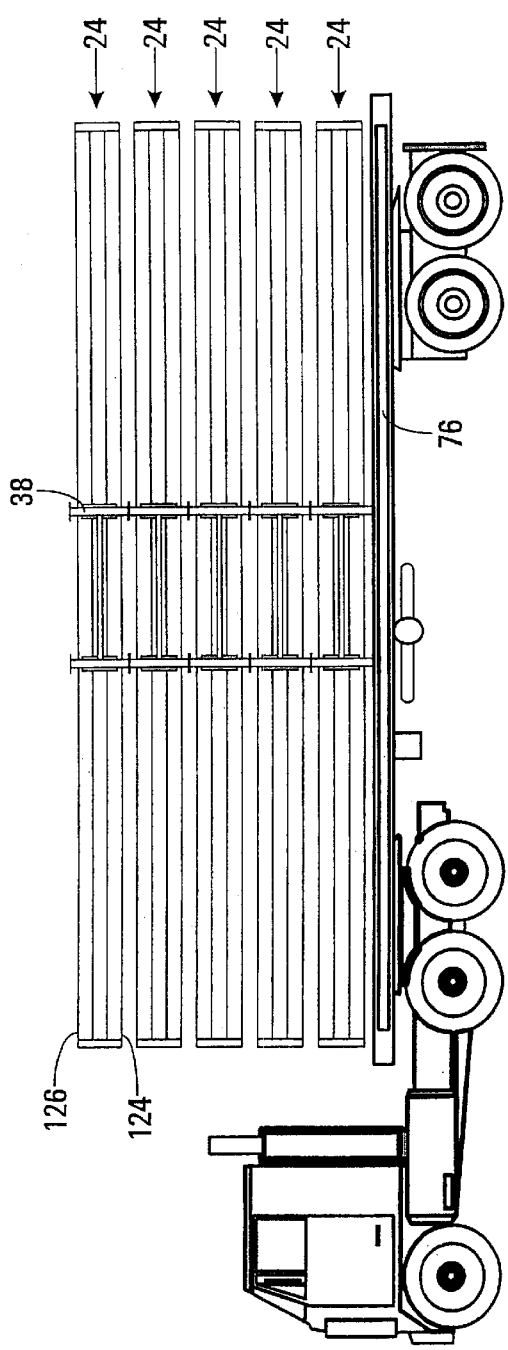
FIG. 5 shows a side view of a plurality of high-concentration photovoltaic assemblies coupled to a truck bed for transport in accordance with a preferred embodiment of the present invention.

FIG. 5 shows a side view of a plurality of HCPV assemblies 24 coupled to a truck bed 76 for transport in accordance with a preferred embodiment of the present invention. The following discussion refers to FIGS. 3, 4, and 5.

Because feet 68 are at the dimensional extremities of HCPV assemblies 24, assemblies 24 may be safely coupled to form a stack for storage and/or transport. This is exemplified in FIG. 5, where a stack of HCPV assemblies 24 is coupled to bed 76 of a truck 78 for transport.

Each assembly 24 is constructed for use out of doors. Each assembly 24 is therefore constructed to be exposed to the weather, including wind in excess of the "wind" created by truck 78 during transport. Hence, assemblies 24 need only be securely fastened (e.g., bolted) together and to truck bed 76 to allow safe transport.

Assembly 24 has a length 50 of at least 375 cm (147.5 inches) and no more than 1675 cm (659.5 inches), and a breadth 52 of at least 240 cm (94.5 inches) and no more than 375 cm (147.5 inches). By adhering to these minimum and maximum dimensions, assembly 24 remains large enough to be practical for a utility-grade system, yet small enough to be truck transportable. In the preferred embodiment, assembly 24 has a length of approximately 1362.7 cm (536.5 inches) and a breadth of 316.2 cm (124.5 inches). A stack of assemblies 24 is therefore easily transportable by truck 78 without recourse to "wide load" or other restrictions. The ease of transport of factory-built assemblies 24 from factory to field site effects a further cost savings over the prior art.

The following discussion refers to FIGS. 3 and 4.

Feet 68 on back side 48 are configured to be coupled to mounts 36 (FIG. 2) of support 22. Framing members 62 support the full weight of assembly 24. This weight is transferred through legs 66 and feet 68 to mounts 36. By coupling only to feet 68, support 22 supports assembly 24.

Since mounts 36 couple only to feet 68, the physical mounting of an HCPV assembly 24 to a support 22 becomes a rapid and efficient operation. Indeed, the mounting of all assemblies 24 to a given support 22 is expected to be safely accomplished in less than a single day, with significantly reductions in crane time, field labor, and the costs thereof over the prior art.

Figure 7:
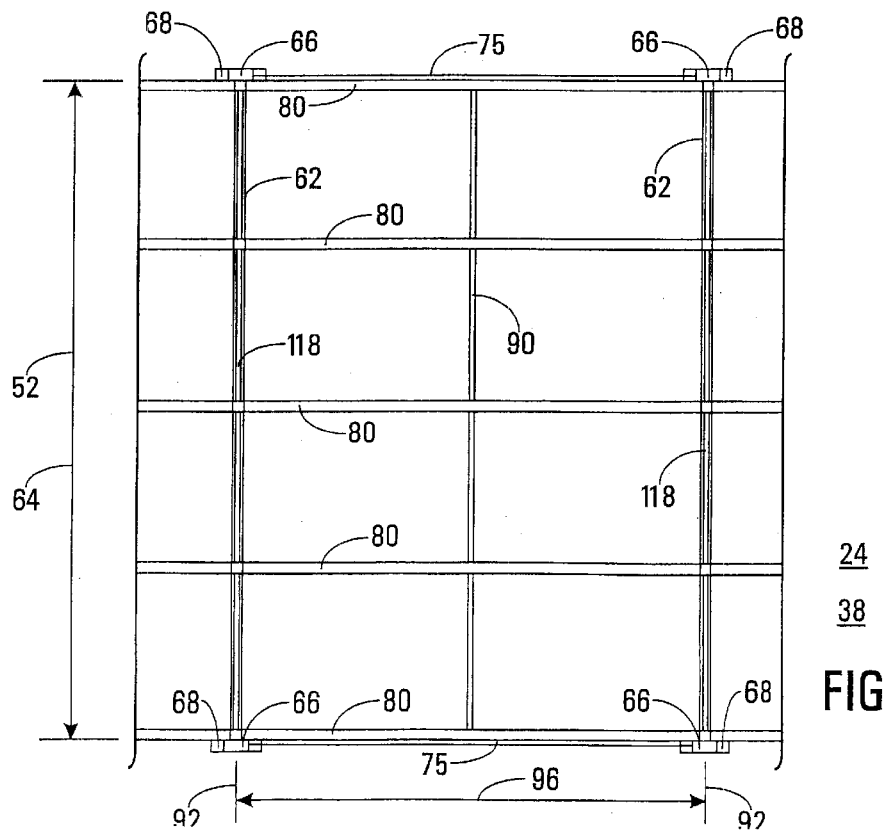
FIG. 7 shows a top view of a portion of a high-concentration photovoltaic assembly demonstrating a frame coupled therein in accordance with a preferred embodiment of the present invention.
Figure 6:
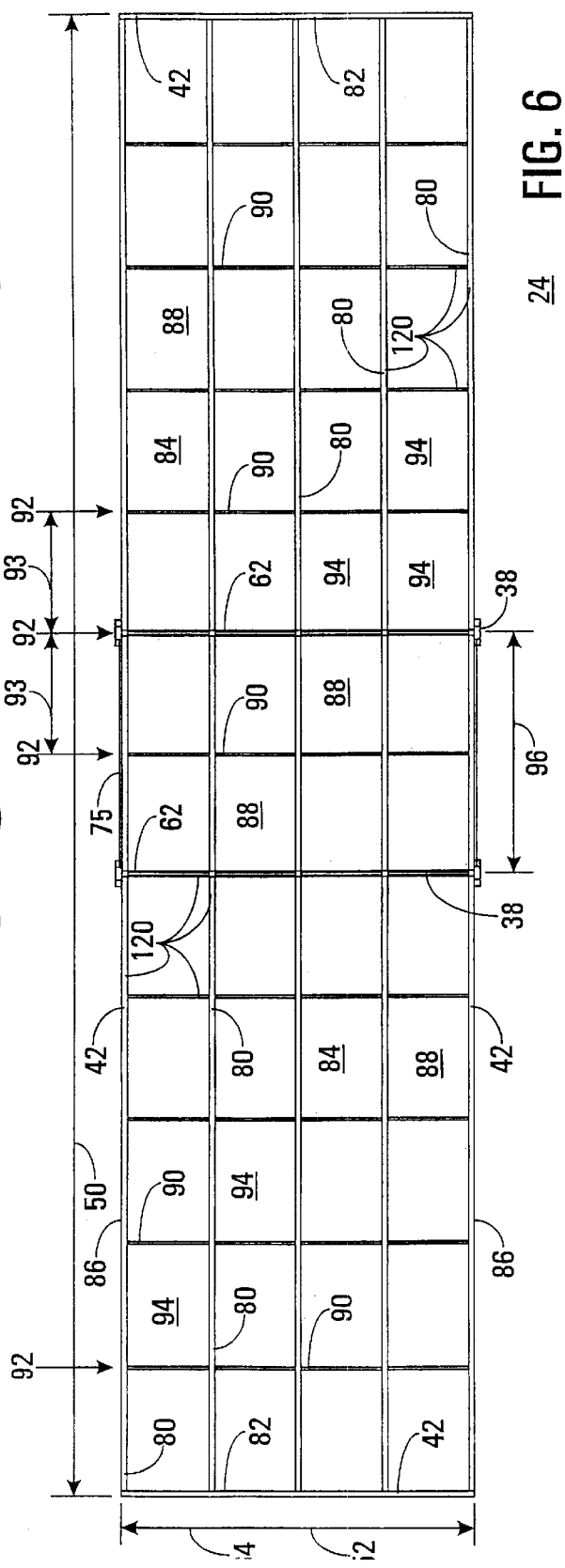
FIG. 6 shows a top view of a high-concentration photovoltaic assembly with lenses and modules removed in accordance with a preferred embodiment of the present invention.

FIG. 6 shows a top view of HCPV assembly 24 with front and back components removed, and FIG. 7 shows an enlargement of a central portion of FIG. 6 demonstrating the coupling of frame 38 into assembly 24 in accordance with a preferred embodiment of the present invention. The following discussion refers to FIGS. 3, 4, 6, and 7.

A body of HCPV assembly 24 is made up of a plurality, including at least two but preferably more, of substantially parallel longitudinal members 80. A pair of substantially parallel transverse members 82 is coupled to the ends of longitudinal members 80. Transverse members 82 and outer ones of longitudinal members 80 together are perimeter members 42, and form a substantially right parallelepipedic structure having a substantially rectangular periphery 86. Interior ones of longitudinal members 80 divide an interior 84 into channels 88. Bulkheads 90 are coupled between adjacent ones of longitudinal members 80 at positions 92 having substantially regular intervals 93 to divide channels 88 into substantially right parallelepipedic chambers 94.

By forming substantially right parallelepipedic chambers 94, all joins between longitudinal members 80 and transverse members 82 and between longitudinal members 80 and bulkheads 90 are substantially right angles. This results in an efficient use of space and an economy of assembly. By coupling bulkheads 90 to longitudinal members 80 at substantially regular intervals 93, chambers 94 will all have substantially identical lengths and breadths (not specified). This allows all lenses and modules (discussed hereinafter) to be substantially identical, thereby effecting a quantity savings in the costs of these components and as ease of replacement thereof in the field.

Framing members 62 have a center-to-center distance 96 substantially coincident with bulkhead positions 92 of HCPV assembly 24. Desirably, center-to-center distance 96 is at least 120 cm (47 inches) and no more than 350 cm (138 inches). This allows a reasonable spread between mounts 36 of support 22, while still allowing the components of support 22 (other than the foundation, which is typically cast on site) to be factory-built and transportable by standard trucks, thereby effecting further cost reductions.

In the preferred embodiment, framing members 62 are located at the bulkhead positions 92 adjacent to, but not at, a center of assembly 24. The bulkheads 90 located at these positions 92 are different from the bulkheads 90 located at other positions 92. This is discussed in more detail hereinafter in conjunction with FIG. 10.

Figure 8:
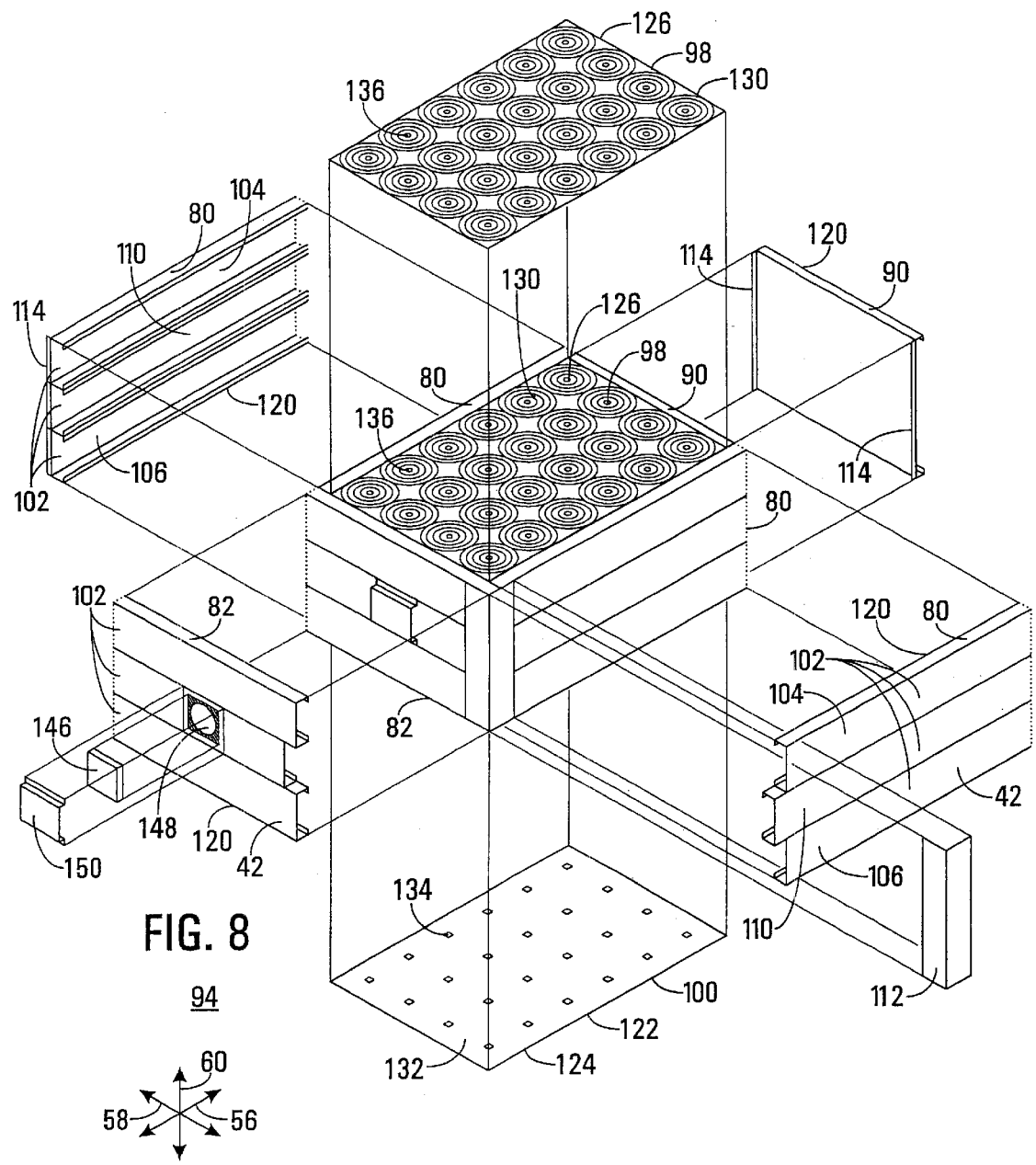
FIG. 8 shows oblique and exploded front views of a chamber within a high-concentration photovoltaic assembly demonstrating the structure and coupling of longitudinal members, transverse members, bulkheads, composite lenses, and photovoltaic modules in accordance with a preferred embodiment of the present invention.

FIG. 8 shows oblique and exploded front views of a corner chamber 94 within HCPV assembly 24, being the chamber 94 lowest down in FIG. 3. FIG. 8 demonstrates the structure and coupling of longitudinal members 80, transverse members 82, bulkheads 90, composite lenses 98, and photovoltaic modules 100 in accordance with a preferred embodiment of the present invention The following discussion refers to FIGS. 3, 6, and 8.

Each longitudinal member 80 of HCPV assembly 24 is formed of three spars 102 coupled substantially edgewise over their lengths. Spars 102 on front and back sides 46 and 48 of reference plane 44 are contiguous over substantially length 50 of assembly 24. A central spar 102 is not contiguous, but is broken to allow passage of framing members 62 (FIG. 6). This is discussed in more detail hereinafter in conjunction with FIG. 10.

Spars 102 each have a "C" cross section (FIG. 8). Desirably, spars 102 are common framing members for commercial buildings, as used in the construction trades. These framing members need only be cut to length and joined. This eliminates the need for custom-made components and further lowers the fabrication costs of assemblies 24. In the preferred embodiment, all three spars 102 are common 18-gauge framing members having substantially identical "C"-shaped cross sections of approximately 17.8× 6.4 cm (7×2.5 inches).

Spars 102 may be joined along their lengths by screws, bolts, rivets, welds, adhesives, or other fasteners (not shown) to form longitudinal members 80 as composite beams. This results in HCPV assembly 24 being highly resistant to flexing in a perpendicular direction (i.e., substantially perpendicular to reference plane 44).

When reference plane 44 is horizontal, the ends of longitudinal members 80 protruding beyond framing members 62 act as cantilevers. Gravity, pulling on these cantilevers, causes the ends of longitudinal members 80 to deflect downward. This places spar 102 on front side 46 of reference plane 44 in tension (i.e., upper-side spar 102 is tension spar 104) and spar 102 on back side 48 of reference plane 44 in compression (i.e., back-side spar 102 is compression spar 106). Central spar 102 is a filler spar 110. Filler spar 110 serves to couple and separate tension and compression spars 104 and 106. Because filler spar 110 is coupled to tension and compression spars 104 and 106 throughout their lengths, filler spar 110 also serves to transfer shear between tension and compression spars 104 and 106. By being contiguous over their entire lengths, tension and compression spars 104 and 106 exhibit maximum longitudinal integrity. In the preferred embodiment, this results in a dead-load deflection at the ends of assembly 24 of less than 0.32 cm (0.125 inch).

Transverse members 82 of HCPV assembly 24 are substantially identical in construction to longitudinal members 80. That is, each transverse member 82 is formed of three spars 102 having "C"-shaped cross sections and coupled substantially edgewise over their lengths. Ideally, transverse members 82 utilize the same common 18-gauge framing members as longitudinal spars 80. Since frame 38 does not intersect transverse members 82, all three spars 102 thereof are contiguous over substantially breadth 52 of HCPV assembly 24.

Bulkheads 90 (FIG. 8) also have a "C"-shaped cross section, but extend over depth 54 of assembly 24. The majority of bulkheads 90 (i.e., all except those coincident with framing members 62) are substantially alike and may be formed of ordinary sheet metal on readily available brakes and other common machine shop tools. This, too, effects a reduction in assembly costs.

Figure 9:
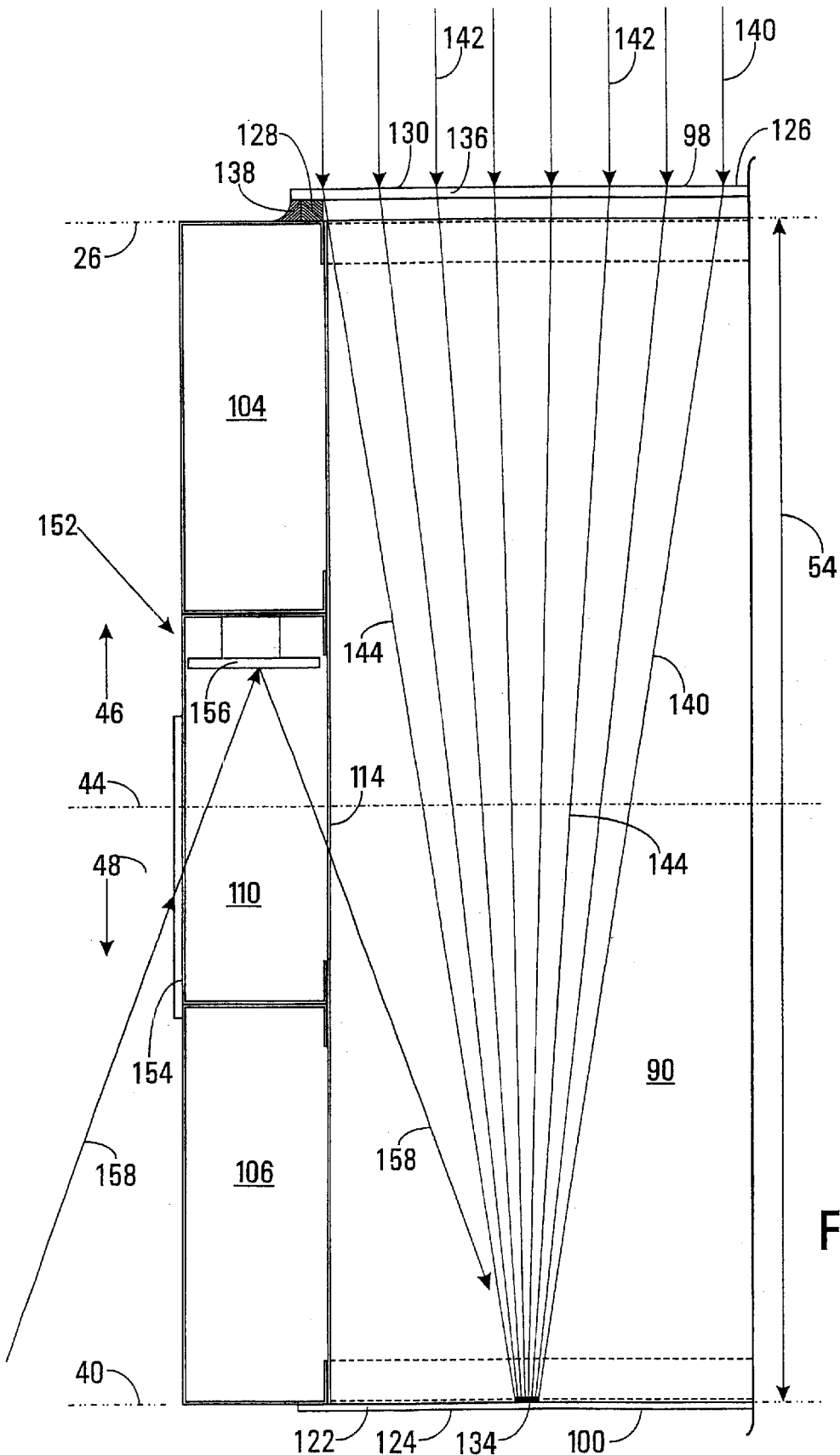
FIG. 9 shows a cross sectional end view of a portion of a high-concentration photovoltaic assembly at a longitudinal member in accordance with a preferred embodiment of the present invention.
Figure 10:
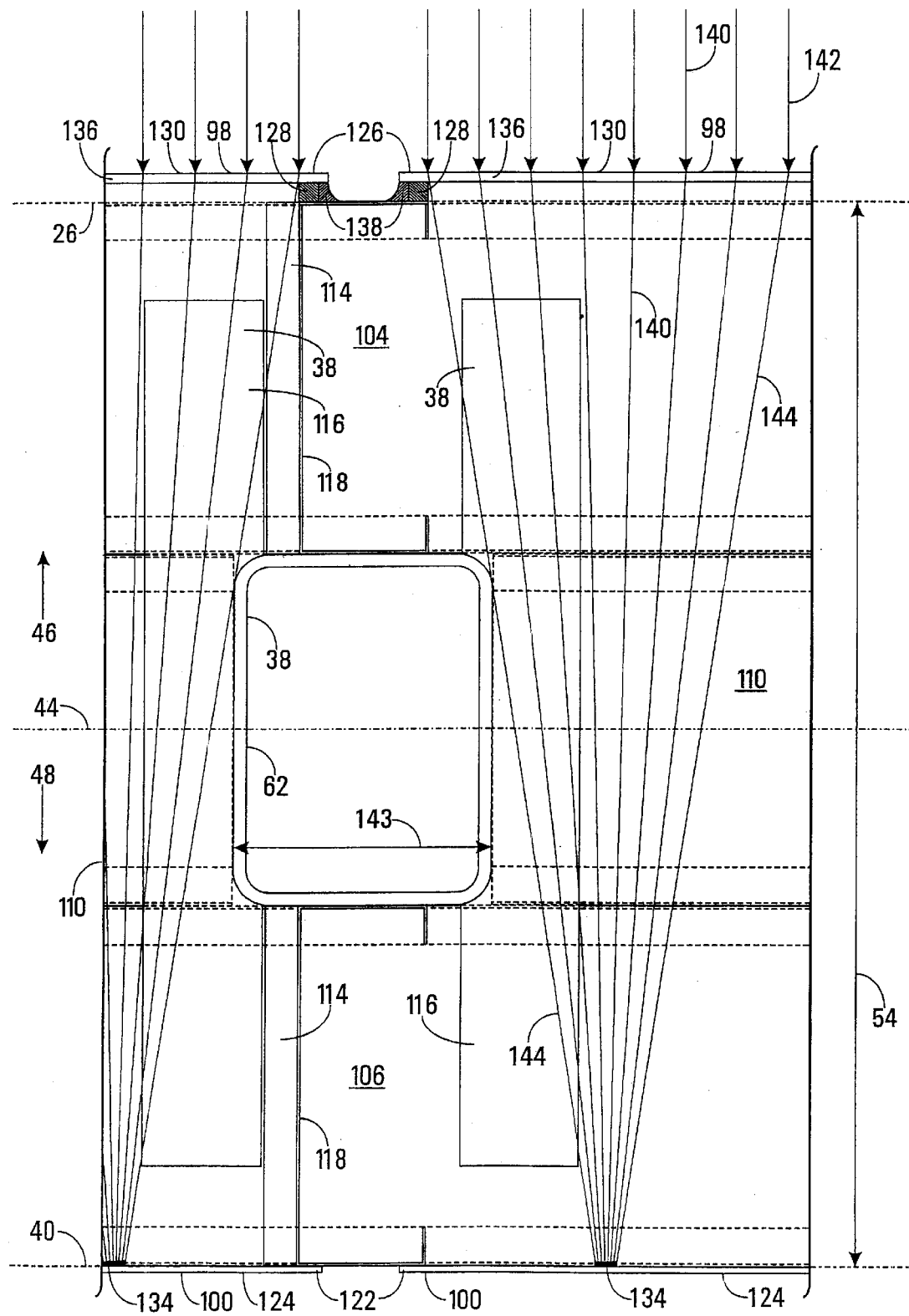
FIG. 10 shows a cross sectional side view of a portion of a high-concentration photovoltaic assembly at a frame member in accordance with a preferred embodiment of the present invention.

FIG. 9 shows a cross sectional end view of a portion of HCPV assembly 24 at a longitudinal member 80, and FIG. 10 shows a cross sectional side view of a portion of HCPV assembly 24 at a frame member 38 in accordance with a preferred embodiment of the present invention. The following discussion refers to FIGS. 3, 4, 6, 8, 9, and 10.

In the preferred embodiment, perimeter members 42 (i.e., transverse members 82 and outer ones of longitudinal members 80) are coupled together by overlapping spars 102 and by corner plates 112 (FIGS. 3 and 8). This overlapping, in conjunction with corner plates 112, forms a strong and predominantly inflexible basic structure for assembly 24. Interior ones of longitudinal members 80 are coupled to transverse members 82 by flanges 114 (FIG. 8) bent from the ends of spars 102. Similar flanges 114 (FIGS. 8 and 9) couple bulkheads 90 to longitudinal members 80.

FIG. 10 depicts the intersection of a longitudinal member 80 by a framing member 62. At intervals substantially coinciding with the "flat" surfaces of longitudinal members 80 (i.e., the closed side of the "C"-shaped cross sections), framing members have affixed mounting brackets 116. Mounting brackets 116 extend in perpendicular direction 60. Mounting brackets 116 couple framing members 62 to the tension, filler, and compression spars 104, 110, and 106 of each longitudinal member 80.

In the preferred embodiment, framing members 62 are substantially centered on reference plane 44. Ideally, the dimensions of framing members 62 in perpendicular direction 60 are substantially equal to or less than the dimensions of filler spar 110 in perpendicular direction 60. This allows tension and compression spars 104 and 106 to be contiguous by passing framing members 62 on front and back sides 46 and 48 Filler spars 110 are not contiguous, and are interrupted by framing members 62.

Framing members 62 reside at locations normally occupied by bulkheads 90. Therefore, partial bulkheads 118 are coupled to longitudinal members 80 on front and back sides 46 and 48 of framing members 62. Partial bulkheads 118 are reduced-depth versions of bulkheads 90.

Interior 84 of HCPV assembly 24 is partitioned into chambers 94 (FIGS. 6 and 8). Each chamber 94 is encompassed by four walls 120. Two walls 120 are formed by longitudinal members 80. The remaining two walls 120 are formed of one transverse member 82 and one bulkhead 90 (FIG. 8), two bulkheads 90, or one bulkhead 90 and one framing member 62 with two partial bulkheads 118.

Back 122 and front 126 of HCPV assembly 24 are formed of a plurality of energy conversion modules 100 and a plurality of energy concentration devices 98. Those skilled in the art will appreciate that an energy conversion module 100 incorporates at least one device, e.g., a photovoltaic or thermal-photovoltaic cell, configured to convert light into electrical energy. Similarly, those skilled in the art will appreciate that an energy concentration device 98 incorporates at least one component configured to concentrate (i.e., focus) light, e.g., a lens, a mirror, or other like instrument.

For the remainder of this document, energy conversion modules 100 are assumed to be photovoltaic (PV) modules 100 and energy concentration devices 98 are considered to composite lenses (i.e., lens arrays) 100. The use of alternative energy conversion modules 100 and alternative energy concentration devices 98 does not depart from the spirit of the present invention.

In the preferred embodiment, back 122 of HCPV assembly 24 is formed of a plurality of photovoltaic (PV) modules 100. PV modules 100 are coupled to assembly 24 substantially at back plane 40. Each PV module 100 is coupled to the four walls 120 of a given chamber 94 and becomes a back 124 of that chamber 94.

Similarly, front 126 of HCPV assembly 24 is formed of a plurality of composite lenses 98. Composite lenses 98 are coupled to assembly 24 substantially at front plane 26. Each composite lens 98 is coupled via mounting spacers 128 to the four walls 120 of a given chamber 94 and becomes a front 130 of that chamber 94.

Each PV module 100 is typically formed of a metal plate 132 to which a plurality of PV cells 134 is affixed. Each PV cell 134 will generate power when concentrated sunlight is focused thereupon. Since all chambers 94 have substantially identical lengths and substantially identical breadths, all PV modules are substantially identical. This, too, effects reductions in component and assembly costs.

Each composite lens 98 is formed of a plurality of Fresnel lenses 136, each having an independent focal path. The number and positions of Fresnel lenses 136 in composite lens 98 is equivalent to the number and positions of PV cells 134 in PV module 100. The focal length of each Fresnel lens 136 is substantially equal to a distance between that Fresnel lens 136 and the PV cell 134 associated therewith after assembly. Therefore, when all composite lenses 98 and PV modules 100 have been mounted in place and calibrated, substantially all sunlight having an incidence substantially perpendicular to aperture plane 26 (i.e., to reference plane 44) and falling upon composite lenses 98 will be focussed onto PV cells 134.

Composite lenses 98 are coupled to front 126 of HCPV assembly 24 by means of mounting spacers 128 and a glazing compound 138 (FIGS. 9 and 10). Spacers 128 establish the proper distance between composite lenses 98 and PV modules 100. Spacers 128 also allow optical alignment of lenses 98 during factory assembly. Glazing compound 138 affixes compound lenses 98 into position once alignment has been completed. By being optically aligned in the factory during assembly, field costs and time are significantly reduced.

In the preferred embodiment, mounting spacers 128 and glazing compound 138 are formed of materials having sufficient flexibility to compensate for differences in thermal expansion and contraction between composite lenses 98 and walls 120 of chambers 94. Spacers 128 and glazing compound 138 are desirably formed of UV resistant materials. Desirably, the materials of spacers 128 and glazing compound 138 will not outgas or otherwise deteriorate over time so as to contaminate either lenses 98 or PV cells 134.

Referring to FIGS. 9 and 10, sunlight 140 enters a Fresnel lens 136 as substantially perpendicular parallel rays 142. Fresnel lens 136 bends sunlight 140 into converging rays 144, which converge at PV cell 134 to cover only the receptive area thereof. Framing member 62 (FIG. 10) is centered at bulkhead position 92 (FIG. 6). A cross-sectional width 143 (FIG. 10) of framing member is preferably as wide as possible of without of intersecting any of converging rays 144.

In the preferred embodiment, each Fresnel lens 136 occupies approximately 316 cm$^2$ (49 square inches). Each PV cell 134 typically generates between 4.1 and 4.2 W$_p$ (peak watts). The preferred embodiment incorporates twenty-four PV cells 134 per PV module 100 (and twenty-four Fresnel lenses 136 per composite lens 98) to generate approximately 100 W$_p$ per PV module 100, i.e., per chamber 94. The preferred embodiment of HCPV assembly 24 incorporates forty-eight chambers 94 (1152 PV cells 134) to generate approximately 4.8 kW$_p$ per assembly 24. If five assemblies 24 were mounted per support 22, then only forty-two such supports 22 are require to produce 1 MW$_p$. If seven assemblies 24 are mounted per support 22, then 1 MW$_p$ may be produced by only thirty supports 22.

In the preferred embodiment, interior 84 of HCPV assembly 24 is substantially sealed to exclude dust and other contaminants. This is effected by using a sealant (not shown), e.g., silicone, between external components (other than composite lenses 98) during assembly. Provisions are made to allow moisture to dissipate and pressures to equalize. This may be accomplished using a filter 146. In FIG. 8, filter 146 is depicted as being mounted over a vent opening 148 and held in place by a filter cover 150.

The use of specific filters 146, filter covers 150, and vent openings 148 is not a requirement of the present invention. It will be understood that filter 146 may be any suitable filter well known to those skilled in the art. Also, the forms of vent opening 148 and/or filter cover 150 may be any desired forms suitable for the specific filter 146 used.

Variations in the form, number, and/or locations of filters 146, vent openings 148, and/or filter covers 150 does not depart from the spirit of the present invention.

Once HCPV assemblies 24 have been mounted to a support 22, it is desirable that proper tracking alignment be established and maintained. It is desirable, therefore, that proper orientation of an assembly 24 be ascertainable in a direct and simple manner. In the preferred embodiment, this is accomplished through an optional inspection port structure 152 (FIG. 9). Inspection port structure 152 is made up of a window 154 in a perimeter member 42 and a mirror 156. Window 154 and mirror 156 are positioned so a reflection of a PV cell 134 is visible to an observer via a sight line 158. The observer may then readily ascertain if concentrated sunlight is falling fully upon PV cell 134. Desirably, assembly 24 incorporates multiple inspection port structures 152.

In summary, the present invention teaches a high-concentration photovoltaic assembly 24 for use in a utility-scale power generation system 20. Assembly 24 is configured to be fabricated and aligned in a factory and readily transported by aircraft, train, and/or truck from the factory to the site of system 20. Each HCPV assembly 24 contains a frame 38 configured to support assembly 24 and couple assembly 24 to a support 22 of system 20. Each HCPV assembly 24 is one of a plurality of substantially identical assemblies 24 configured to mount to one support 22. Each HCPV assembly 24 is sufficiently rigid to support its own weight and maintain alignment during use.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A high-concentration photovoltaic (HCPV) assembly configured for use in a utility-scale power generation system, said HCPV assembly comprising:
    a plurality of substantially parallel framing members substantially centered in a plane and configured to couple to a supporting tracking structure of said system;
    a plurality of substantially parallel longitudinal members substantially centered in said plane, wherein each of said longitudinal members comprises:
        a compression spar contiguous between ends of said longitudinal member and coupled to said framing members upon said first side of said plane; and
        a tension spar contiguous between said ends of said longitudinal member and coupled to said framing members upon a second side of said plane;
    a plurality of energy conversion modules coupled to adjacent ones of said longitudinal members upon a first side of said plane; and
    a plurality of energy concentration devices coupled to adjacent ones of said longitudinal members.

2. An HCPV assembly as claimed in claim 1 wherein said compression and tension spars have substantially identical cross sections.

3. An HCPV assembly as claimed in claim 1 wherein:
    each of said framing members is contiguous;
    each of said longitudinal members additionally comprises a non-contiguous filler spar; and
    said non-contiguous filler spar is intersected by said framing members.

4. An HCPV assembly as claimed in claim 1 wherein each of said longitudinal members additionally comprises a filler spar coupled between said compression and tension spars.

5. An HCPV assembly as claimed in claim 4 wherein said compression, filler, and tension spars have substantially identical cross sections.

6. An HCPV assembly as claimed in claim 1 wherein said compression and tension spars have "C"-shaped cross sections.

7. An HCPV assembly as claimed in claim 1 additionally comprising two substantially parallel transverse members substantially centered in said plane and coupled to said longitudinal members substantially at ends thereof, wherein outer ones of said longitudinal members and said transverse members together form a periphery of said HCPV assembly.

8. An HCPV assembly as claimed in claim 7 wherein each of said longitudinal and transverse members has a substantially identical cross section.

9. An HCPV assembly as claimed in claim 1 additionally comprising:
   two transverse members substantially centered in said plane, oriented substantially parallel to each other, and coupled to said longitudinal members substantially at ends thereof;
   a periphery formed of outer ones of said longitudinal members and said transverse members; and
   a plurality of bulkheads coupled between adjacent ones of said longitudinal members and configured to form chambers within said HCPV assembly.

10. An HCPV assembly as claimed in claim 9 wherein:
    said bulkheads are coupled between adjacent ones of said longitudinal members at positions having substantially regular intervals; and
    each of said framing members intersects and is coupled to said longitudinal members at substantially one of said positions of said bulkheads.

11. An HCPV assembly as claimed in claim 9 wherein:
    each of said energy conversion modules is configured to form a first one of a back and a front of one of said chambers; and
    each of said energy concentration devices is configured to form a second one of a front and a back of one of said chambers.

12. An HCPV assembly as claimed in claim 1 wherein said a plurality of substantially parallel longitudinal members comprises at least three of said longitudinal members.

13. An HCPV assembly as claimed in claim 1 wherein:
    each of said plurality of energy conversion modules is a photovoltaic module comprising a plurality of photovoltaic cells; and
    each of said plurality of energy concentration devices is a lens array comprising a plurality of lenses, wherein each of said lenses is optically coupled to one of said photovoltaic cells.

14. A high-concentration photovoltaic (HCPV) assembly configured for use in a utility-scale power generation system, said HCPV assembly comprising:
    a plurality of substantially parallel longitudinal members substantially centered in a plane, each of said longitudinal members incorporating a compression spar and a tension spar, and each of said compression and tension spars being contiguous between opposing ends of said HCPV assembly a plurality of substantially parallel framing members substantially centered in said plane, coupled to each of said longitudinal members;
    two substantially parallel transverse members substantially centered in said plane and coupled to said longitudinal members substantially at ends thereof;
    a plurality of energy conversion modules coupled to adjacent ones of said longitudinal members upon a first side of said plane; and
    a plurality of energy concentration devices coupled to adjacent ones of said longitudinal members upon a second side of said plane.

15. An HCPV assembly as claimed in claim 14 wherein said framing members are configured to couple to a supporting tracking structure of said system.

16. An HCPV assembly as claimed in claim 14 wherein said framing members are displaced from each other by a distance equal to or greater than 120 cm and equal to or less than 350 cm.

17. An HCPV assembly as claimed in claim 14 wherein:
    each of said longitudinal members has a length equal to or greater than 375 cm and equal to or less than 1675 cm; and
    each of said transverse members has a length equal to or greater than 240 cm and equal to or less than 375 cm.

18. An HCPV assembly as claimed in claim 14 wherein:
    said HCPV assembly additionally comprises a plurality of bulkheads coupled between adjacent ones of said longitudinal members and configured to divide said HCPV assembly into a plurality of substantially right parallelepipedic chambers having four walls;
    each of said walls is one of said longitudinal members, said transverse members, and said bulkheads;
    each of said energy conversion modules is configured to form a back of one of said chambers and is coupled to said four walls thereof; and
    each of said energy concentration devices is configured to form a front of one of said chambers and is coupled to said four walls thereof.

19. An HCPV assembly as claimed in claim 14 wherein:
    outer ones of said longitudinal members and said transverse members, form a periphery of said HCPV assembly and partially enclose an interior thereof;
    said plurality of energy conversion modules is configured to form a back of said HCPV assembly and further enclose said interior;
    said plurality of energy concentration devices is configured to form a front of said HCPV assembly and further enclose said interior; and
    said HCPV assembly additionally comprises a filter coupled to said periphery and through which said interior maintains intercourse with the atmosphere.

20. An HCPV assembly as claimed in claim 14 wherein:
    outer ones of said longitudinal members and said transverse members, form a periphery of said HCPV assembly;
    each of said energy conversion modules is a photovoltaic module having a plurality of photovoltaic cells; and
    said HCPV assembly additionally comprises an inspection port structure coupled to said periphery and configured to allow inspection of one of said photovoltaic cells to ascertain alignment of said HCPV assembly relative to the sun.

21. A high-concentration photovoltaic (HCPV) assembly configured for use in a utility-scale power generation system, said HCPV assembly comprising:
    a plurality of substantially parallel longitudinal members;
    two substantially parallel transverse members having a first length and coupled to said longitudinal members substantially at ends thereof;
    a frame substantially centered in a plane, coupled to said longitudinal members, configured to couple to a supporting tracking structure of said system, and comprising a plurality of framing members, wherein each of said framing members has a second length equal to or greater than said first length, and wherein each of said framing members is contiguous over said second length;
    a plurality of energy conversion modules coupled to adjacent ones of said longitudinal members upon a first side of said plane; and
    a plurality of energy concentration devices coupled to adjacent ones of said longitudinal members upon a second side of said plane.

22. An HCPV assembly as claimed in claim 21 wherein each of said framing members is formed of a metallic tubing.

23. An HCPV assembly as claimed in claim 21 wherein each of said longitudinal members comprises:
- a first contiguous spar coupled to said frame on a first side of said plane;
- a second contiguous spar coupled to said frame on a second side of said plane; and
- a non-contiguous spar coupled between said first and second contiguous spars and coupled to said frame.

24. An HCPV assembly as claimed in claim 23 wherein each of said framing members intersects said non-contiguous spar of each of said longitudinal members, and each of said framing members has a dimension in a direction substantially perpendicular to said plane equal to or less than a dimension of said non-contiguous spar in said direction.

25. An HCPV assembly as claimed in claim 21 wherein said frame additionally comprises a plurality of mounting brackets extending in a direction substantially perpendicular to said plane.

26. An HCPV assembly as claimed in claim 21 wherein:
- each of said framing members passes through said plurality of longitudinal members; and
- said frame additionally comprises:
  - a plurality of legs, wherein one of said legs is coupled to each end of each of said framing members; and
  - a plurality of feet wherein one of said feet is coupled to one end of each of said legs.

27. An HCPV assembly as claimed in claim 26 wherein:
- said plane is a first plane;
- said energy conversion modules reside in substantially a second plane substantially parallel to said first plane upon said first side thereof; and
- said feet reside substantially in a third plane substantially parallel to said first plane upon said first side thereof and farther from said first plane than said second plane.

28. An HCPV assembly as claimed in claim 21 wherein:
- each of said framing members passes through said plurality of longitudinal members; and
- said frame additionally comprises:
  - a plurality of legs, wherein one of said legs is coupled to each end of each of said framing members; and
  - a plurality of feet wherein one of said feet is coupled to one end of each of said legs upon said first side of said plane and one of said feet is coupled to one end of each of said legs upon said second side of said plane.

29. An HCPV assembly as claimed in claim 28 wherein:
- said plane is a first plane;
- said energy conversion modules reside in substantially a second plane substantially parallel to said first plane upon said first side thereof;
- said feet coupled to said legs upon said first side of said first plane reside substantially in a third plane substantially parallel to said first plane upon said first side thereof and farther from said first plane than said second plane;
- said energy concentration devices reside in substantially a fourth plane substantially parallel to said first plane upon said second side thereof; and
- said feet coupled to said legs upon said second side of said first plane reside substantially in a fifth plane substantially parallel to said first plane upon said second side thereof and farther from said first plane than said fourth plane.

30. A utility-scale solar power generation system having a plurality of high-concentration photovoltaic (HCPV) assemblies, wherein each of said HCPV assemblies is configured to couple to a supporting tracking structure of said system, and wherein each of said HCPV assemblies comprises:
- a frame substantially centered in a plane;
- a plurality of substantially parallel longitudinal members substantially centered in said plane and coupled to said frame, each of said longitudinal members comprising:
  - a contiguous compression spar coupled to said frame upon a first side of said plane;
  - a contiguous tension spar coupled to said frame upon a second side of said plane; and
  - a non-contiguous filler spar coupled between said compression and tension spars, coupled to and intersected by said frame;
- two substantially parallel transverse members substantially centered in said plane and coupled to said longitudinal members substantially at ends thereof;
- a plurality of bulkheads coupled between adjacent ones of said longitudinal members and configured to divide said HCPV assembly into a plurality of chambers having four walls, each of said walls being one of said longitudinal members, said transverse members, and said bulkheads;
- a plurality of photovoltaic modules, each of said photovoltaic modules being coupled to said four walls of one of said chambers upon said first side of said plane; and
- a plurality of lenses, each of said lenses being coupled to said four walls of one of said chambers upon said second side of said plane.

* * * * *